(12) United States Patent
Brady

(10) Patent No.: US 10,692,559 B2
(45) Date of Patent: Jun. 23, 2020

(54) PERFORMING AN ON DEMAND REFRESH OPERATION OF A MEMORY SUB-SYSTEM

(71) Applicant: Micron Technology, Inc., Boise, ID (US)

(72) Inventor: Michael T. Brady, Loveland, CO (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/177,216

(22) Filed: Oct. 31, 2018

(65) Prior Publication Data

US 2020/0135264 A1 Apr. 30, 2020

(51) Int. Cl.
| | |
|---|---|
| *G11C 11/56* | (2006.01) |
| *G11C 11/406* | (2006.01) |
| *G11C 11/419* | (2006.01) |
| *G11C 16/16* | (2006.01) |
| *G06F 12/02* | (2006.01) |
| *G06F 11/34* | (2006.01) |
| *G06F 3/06* | (2006.01) |
| *G11C 11/4076* | (2006.01) |

(52) U.S. Cl.
CPC ........ *G11C 11/40611* (2013.01); *G06F 3/061* (2013.01); *G06F 3/0605* (2013.01); *G06F 3/0632* (2013.01); *G06F 3/0679* (2013.01); *G06F 11/3419* (2013.01); *G06F 12/0246* (2013.01); *G11C 11/4076* (2013.01); *G11C 11/419* (2013.01); *G11C 16/16* (2013.01); *G06F 2201/81* (2013.01); *G06F 2212/1016* (2013.01); *G06F 2212/2022* (2013.01); *G06F 2212/7201* (2013.01); *G11C 2211/4061* (2013.01)

(58) Field of Classification Search
CPC .................................................. G11C 11/5628
USPC .............................. 365/185.22, 185.25, 222
See application file for complete search history.

(56) References Cited

U.S. PATENT DOCUMENTS

| | | | |
|---|---|---|---|
| 5,638,529 A | 6/1997 | Yee et al. | |
| 6,240,032 B1 | 5/2001 | Fukumoto | |
| 8,908,443 B1 * | 12/2014 | Ellis | .................... G11C 11/5628 365/185.22 |
| 8,938,655 B2 | 1/2015 | Hamilton et al. | |
| 9,595,347 B2 | 3/2017 | Zhao et al. | |
| 9,952,802 B2 | 4/2018 | Salah et al. | |
| 2005/0144372 A1 | 6/2005 | Walker | |
| 2015/0253347 A1 | 9/2015 | Cong et al. | |

FOREIGN PATENT DOCUMENTS

KR 10200500369423 A 4/2005

OTHER PUBLICATIONS

PCT Notification of Transmittal of the International Search Report and the Written Opinion of the International Searching Authority for PCT Application No. PCT/US2019/058957, dated Feb. 24, 2020, 12 pages.

* cited by examiner

*Primary Examiner* — Jason Lappas
(74) *Attorney, Agent, or Firm* — Lowenstein Sandler LLP

(57) ABSTRACT

A temporal attribute of user data stored in a memory component is identified. It is determined that the identified temporal attribute satisfies a time condition. An indication is provided whether a refresh operation of the user data improves performance of the memory component. A user input is received indicating to perform the refresh operation of the memory component. The refresh operation of the memory component is performed.

9 Claims, 7 Drawing Sheets

PERFORMING AN ON DEMAND REFRESH OPERATION OF A MEMORY SUB-SYSTEM

TECHNICAL FIELD

Embodiments of the disclosure relate generally to memory sub-systems, and more specifically, relate to performing an on demand refresh operation of a memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
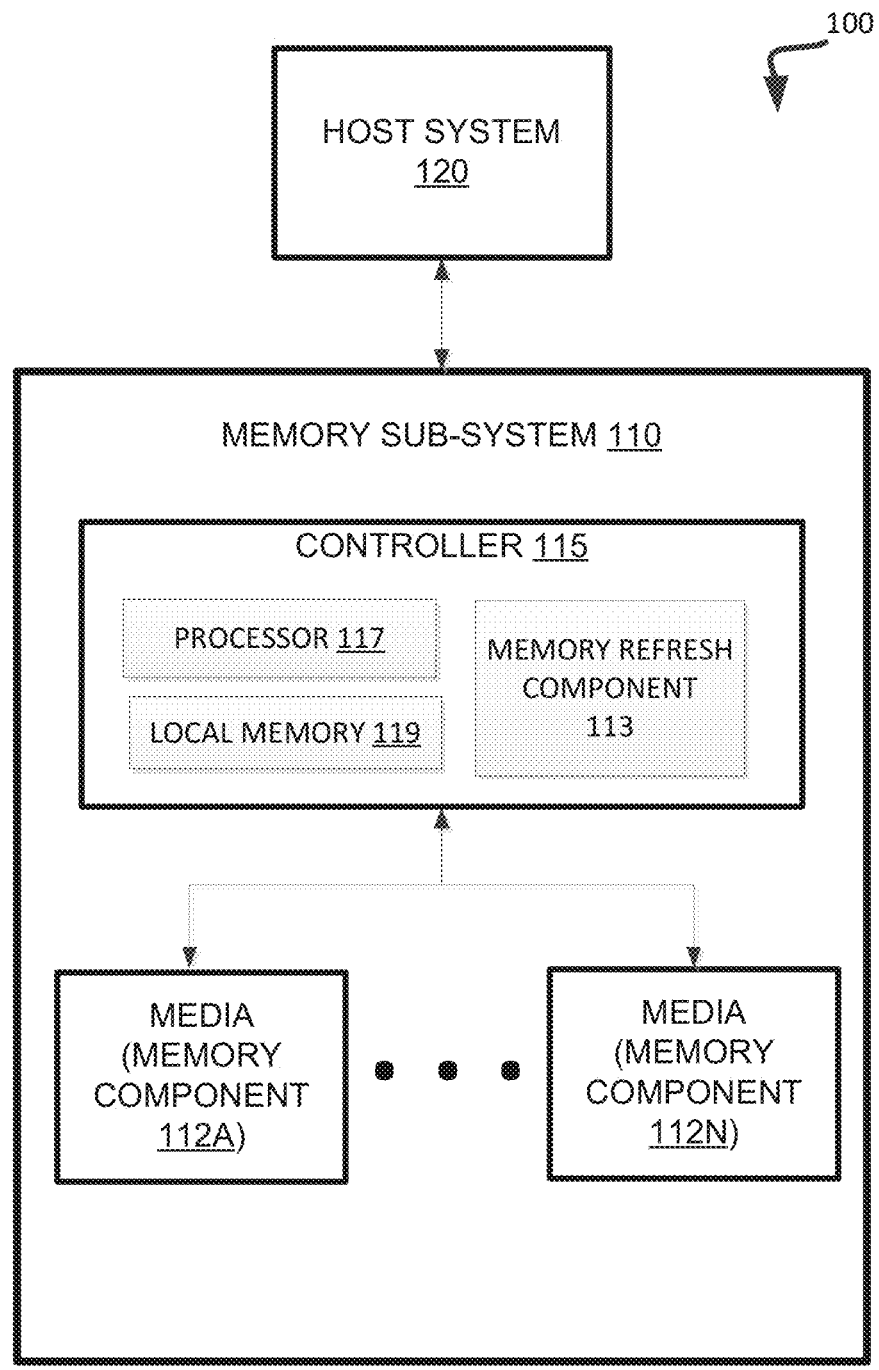
FIG. 1 illustrates an example computing environment that includes a memory sub-system in accordance with some embodiments of the present disclosure.

Aspects of the present disclosure are directed to performing a refresh operation of a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. The memory components can include memory cells that are used to store data. Each memory cell can store data values as a threshold voltage for that particular memory cell. Each distinct threshold voltage range represents a predetermined value for the data stored at the memory cell. Conventional memory sub-systems can store multiple bits of data in a single memory cell by mapping sequences of bits of the data to the different threshold voltage ranges of the memory cell. The data can be stored into the memory cell by using a programming operation that applies a sequence of programming pulses to the memory cell. The sequence of programming pulses can be applied to the memory cell until a voltage level within a corresponding threshold voltage range has been reached at the memory cell. After the memory cell has been programmed, data can be read from the memory cell by applying a read threshold voltage to the memory cell at the corresponding threshold voltage range and translating the observed voltage level at the memory cell to a sequence of one or more binary values.

In a conventional memory sub-system, once the data has been programmed (e.g., written) to a cell, the age of the data begins to increase. The more time passes, the greater the probability that some condition (e.g., a charge loss, etc.) can cause discrepancies between the threshold voltage applied to program the data and the threshold voltage applied to read the data. The change in threshold voltage can cause correctly reading the data difficult, or sometimes impossible. As the recovery of the desired data becomes difficult, the memory sub-system can attempt to use an error handling flow to recover the data.

While in an error handling flow, a conventional memory sub-system can implement an error detection and correction (i.e., an error control) operation for the data that is stored at and/or retrieved from the memory components of the memory sub-system. The error can be detected and corrected based on an error correction/handling operation. The error correction/handling operation can include one or more read retries using different parameters, such as a change in voltage threshold, as the initial read operation performed on the memory cell. The error correction/handling operation can also use hard information that corresponds to the bit values (e.g., a 0 or a 1) read from a memory cell and soft information that corresponds to a probability that the hard information read from the memory cell is accurate to correct the bit values stored at a memory cell.

Error handling operations can be time consuming and impact performance of the memory sub-system. The error handling operations can result in increased read times and/or degraded performance as observed by the host system. The more frequently error handling operation is triggered, the slower the performance of the memory system as fewer read operations and write operations can be performed. Also, the particular location of memory sub-system that enters error handling flow is blocked from taking other commands from the host, resulting in a decrease in the availability of the memory sub-system. There are times when the user or host system can noticeably observe significantly decreased read performance on data that was previously written as a result of the increased error handling operations or blocking as the age of the data stored at memory cells increases.

In a conventional memory sub-system, a background scan can be performed periodically to allow the memory sub-system to perform a background refresh of the memory sub-system. In a background refresh, the data can be reprogrammed on the memory sub-system in order to improve performance of the memory sub-system. For example, data that is stored at one or more memory cells can be reprogrammed to another one or more memory cells. However, a user does not have flexibility to control a background refresh. A user cannot customize the background refresh according to the need of the user, control any setting of the refresh operation, or control the timing of the background refresh (e.g., when to perform the refresh operation). Moreover, during the background refresh, the memory sub-system still attempts to maintain good performance (e.g., certain read and/or write latencies) as the background refresh is performed. As a result, limited types of algorithms can be used in a background refresh so as to not introduce additional performance degradation as the background refresh is being performed. In some conventional memory sub-systems, a backup technology can request the host system to send the user data to be re-written to the memory component. However, requiring the host system to send data is cumbersome, inconvenient, interruptive, and impractical.

Aspects of the present disclosure address the above and other deficiencies by having a memory sub-system that is capable of providing a refresh operation on an on demand basis that is driven by the host system or a user of the host system. In some implementations, a temporal attribute (e.g., age) of user data stored in a memory component can be identified. The memory sub-system can determine that the temporal attribute satisfies a time condition (e.g., age of user data is above a threshold age). An indication can be provided to indicate whether a refresh operation of the user data improves performance of the memory component. Based on the indication, a user can choose to provide a user input to indicate to perform a refresh operation of the memory component. Upon receiving the user input, the refresh operation can be performed.

In some implementations, a mechanism can be employed to prevent the host system from initiating the refresh too frequently. For example, the memory sub-system can determine that a time between the refresh operation and a previously performed refresh operation does not exceed a threshold time. In such a scenario, the memory sub-system can determine not to perform the refresh operation.

In some implementations, once a user has provided a user input to perform a refresh operation, the memory sub-system can optimize user data for the refresh operation by employing various techniques. More optimal algorithms or data alignments are possible in an on demand refresh operation. In a background refresh operation, a small subset of data can be re-organized due to restraints, such as, having limited available memory to reorganize the data. Using the present disclosure, the memory sub-system can send to a host system an initial translation map (e.g., a logical to physical block address translation map). The host system can use its memory and computing resources to store and indicate an optimal pattern of block addresses to be used during an on demand refresh operation. As a result, the memory sub-system can receive a modified translation map (e.g., a re-organized logical to physical block address translation map) from the host system and perform the refresh operation using the modified translation map.

In some implementations, the memory sub-system can identify a type of settings optimization to perform a refresh operation. For example, the type of settings optimization can include a performance optimization, data retention optimization, endurance optimization, read intensive optimization, write intensive optimization, etc. The memory sub-system can then determine a refresh operation parameter, such as, a particular setting to use (e.g., a voltage, a level of current, intensity, duration, number of pulses to apply, etc.) based on the determined type of settings optimization. The memory sub-system can perform the refresh operation using the particular setting.

The present disclosure provides for a mechanism for system administrators and other users to initiate a refresh operation for on demand refresh of the memory sub-system to force the memory sub-system to its original or an improved performance level. Advantages of the present disclosure include, but are not limited to, the increased performance of the memory sub-system as operations can be performed more efficiently and optimally, minimizing latency and without wasting computing resources on performing error correction operations. As a result, the error rate in the memory sub-system can be decreased or eliminated. The on demand refresh mechanism provided herein allows for optimization of the refresh operation and customizing attributes of the optimization. Accordingly, the overall performance of the memory sub-system can be improved and address the needs of the host system.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a memory refresh component 113 that can be used to perform an on demand refresh operation of a memory sub-system. In some embodiments, the controller 115 includes at least a portion of the memory refresh component 113. For example, the controller 115 can include a processor 117 (processing device) configured to execute instructions stored in local memory 119 for performing the operations described herein. In some embodiments, the memory refresh component 113 is part of the host system 120, an application, or an operating system.

The memory refresh component 113 can identify a temporal attribute of user data stored in a memory component. The memory refresh component 113 can determine that the temporal attribute satisfied a time condition. The memory refresh component 113 can provide an indication whether a refresh operation of the user data improves performance of the memory component. The memory refresh component 113 can receive a user input to indicate to perform a refresh operation of the memory component. The memory refresh component 113 can perform the refresh operation of the memory component.

Figure 2:
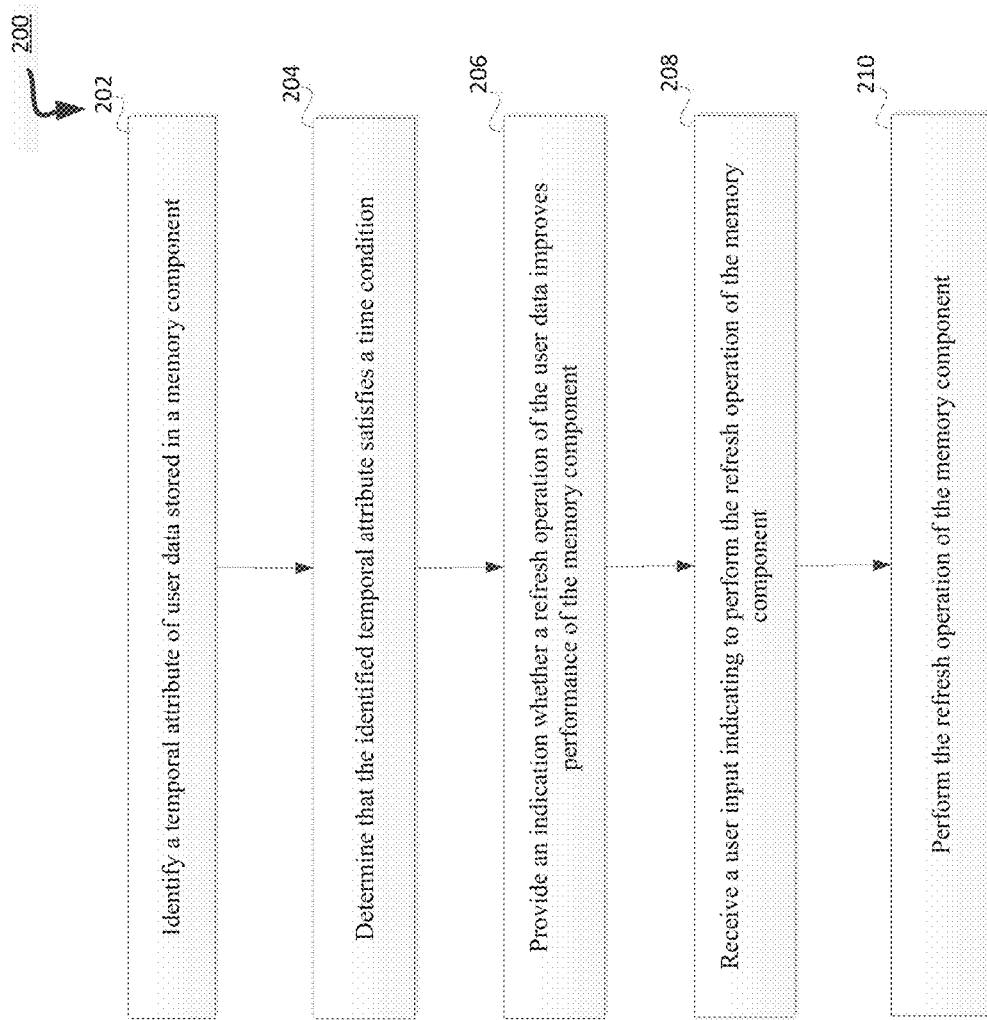
FIG. 2 is a flow diagram of an example method to perform a refresh operation of a memory sub-system based on a temporal attribute of user data, in accordance with some embodiments of the present disclosure.

FIG. 2 is a flow diagram of an example method 200 to perform a refresh operation of a memory sub-system based on a temporal attribute of user data in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 202, the processing device identifies a temporal attribute of user data stored in a memory component. In an example, the temporal attribute can be an age of the user data. In some embodiments, the age of the user data can be an amount of time that has elapsed since the user data was last written to the memory component. In some embodiments, the temporal attribute can be an amount of time that the memory sub-system has been powered on (i.e., power on hours) or an endurance characteristic such as an average number of program-erase cycles that have been performed by the memory sub-system or that have been performed for the memory component. The temporal attribute can be stored as a metadata with the user data and obtained by the processing device.

At operation 204, the processing device determines that the identified temporal attribute satisfies a time condition. As the user data increases in age, the host system can observe significantly decreased read performance on the user data that was written to a memory cell of the memory component. A noticeable decrease in performance can be seen after a certain amount of time has passed after data is written to the memory cell. A time condition can be specified to assess whether the performance of the read operation has degraded significantly. The processing device can determine whether the temporal attribute satisfies the specified time condition. In some examples, the memory sub-system can set a threshold for the temporal attribute in order to assess whether the time condition is satisfied. In some examples, the processing device can determine that the identified temporal attribute is above a threshold temporal attribute. The threshold temporal attribute can be set (e.g., predefined) based on previous experiments, the type of memory component used, etc. The threshold temporal attribute can be a point when the data read performance degradation is typically noticeable.

At operation 206, the processing device provides an indication whether a refresh operation of the user data improves performance of the memory component. In some examples, the indication can be based on the temporal attribute meeting the time condition. For example, the processing device can use an algorithm that uses the age of the user data to determine the benefit of an on demand refresh operation. Such an algorithm can be based on multiple read operations of user data. For example, multiple read operations can be performed by the memory sub-system on a data block of the user data. Each of the read operations can be based on a different read threshold voltage that is applied to the data block of the user data. For example, each of the read threshold voltages can be incremented from the prior read threshold voltage. The read threshold voltage that results in the fewest number of errors in the user data can be considered to be the optimal read threshold voltage. Furthermore, the difference between an original read threshold voltage and the optimal read threshold voltage can indicate an amount of aging of the user data. In some embodiments, if the difference between the original read threshold voltage and the optimal read threshold voltage exceeds a threshold voltage, then the memory sub-system can determine that the refresh operation can improve the performance of the memory component. The processing device can provide at least one of the two following indications: an indication identifying that the refresh operation of the user data improves performance of the memory component, or an indication identifying that the refresh operation of the user data does not improve performance of the memory component. In some examples, the processing device provides a probability of success of the refresh operation of the user data to improve performance of the memory component. In some examples, the processing device provides the indication to a host device coupled to the memory component whether the refresh operation of the user data improves performance of the memory component. In some implementations, the indication can be provided proactively by the processing device, without a user inquiring about the benefits of an on demand refresh operation. In some implementations, the user can initiate a command to receive an indication whether a refresh operation of the user data improves performance of the memory component. The processing device can provide the indication based on the user command to receive the indication.

At operation 208, the processing device receives a user input indicating to perform the refresh operation of the memory component. In some example, the user input can be received from a human user, such as a system administrator or a user of the host system. In some example, the user input can be received from a system user. An example of a system user includes, but is not limited to, an automated process of the host system that is executed at a reoccurring time, a continuous value stream system, a continuous integration system, or a continuous deployment system. In some embodiments, the system user can be a process initiated by a health monitoring system that monitors the memory sub-system. In some examples, a user input can be a command that a user can execute. In some examples, the user input can include parameters and values of the parameters specified by the user. For example, the user can indicate to use a read intensive or write intensive refresh operation. In a read intensive refresh operation, user data is written in a manner such that the user data can be written less frequently and/or slowly, and read more frequently and/or fast. In a write intensive refresh operation, user data is written in a manner such that the user data can be written more frequently and/or fast, and read less frequently and/or slowly. In other examples, the user can indicate to perform the refresh operation by optimizing for performance, data retention, and/or endurance. Performance is a measure of how fast data is read. For example, when optimized for performance, the performance of read operation is increased, that is, read operations can be performed faster and/or more frequently. Data retention is a measure of how long data can be retained in the memory sub-stem. For example, when optimized for data retention, user data can be retained in the memory sub-system for a long period of time. Endurance is a measure of how long an memory sub-system lasts before the memory sub-system is worn out. For example, when optimized for endurance, the memory sub-system can last a long time before the memory sub-system wears out. In some examples, the user can be provided with an indication whether an on demand refresh operation is supported and/or whether the refresh operation is allowed at present. In some examples, the user can initiate a command to receive the indication whether an on demand refresh is supported or allowed at present.

In some implementations, the processing device determines whether a time between the refresh operation and a previously performed refresh operation exceeds a threshold time. The determination of time between the current refresh operation and the previous refresh operation can be used to prevent performing the on demand refresh operation too frequently and degrading the memory sub-system prematurely. If the processing device determines that the time exceeds the threshold time, the processing device performs the refresh operation. If the processing device determines that the time does not exceed the threshold time, the processing device determines not to perform the refresh operation. The processing device can provide an indication that it is too soon to perform another refresh operation since the previous refresh operation. The processing device can provide the wait time before another refresh operation can be performed. In some examples, the processing device can provide an indication including the length of time since the previous refresh operation was performed or was attempted. In some examples, the user can initiate a command to receive the indication including the length of time since the previous refresh operation was performed or was attempted.

At operation 210, the processing device performs the refresh operation of the memory component. In order to perform the refresh operation of the memory component, the processing device can erase the user data from a first location of the memory component and perform a write operation on a second location of the memory component using the user data. In some examples, the first location and the second location are different locations. In some examples, the first location is the same as the second location.

Moreover, the processing device can provide additional information associated with the refresh operation. The additional information can include one or a combination of: a number of total refresh operations attempted by the memory sub-system, a number of successful refresh operations attempted by the memory sub-system, a number of unsuccessful refresh operations attempted by the memory sub-system, an average time to complete refresh operations attempted by the memory sub-system, a standard deviation of time to complete refresh operations attempted by the memory sub-system, a first status of the refresh operation, or a second status of a previous refresh operation attempted by the memory sub-system. In some examples, the status of the previous refresh operation can include one or more of: whether the previous refresh operation is still in progress, completed successfully, failed to complete, etc. If the previous refresh operation is still in progress, the indication can include the run time of the previous refresh operation, percent completed, etc. If the previous refresh operation has completed, the indication can include whether the previous refresh operation was successful or failed. If the previous operation failed, the indication can include details of the failure, including reason for failure, particular blocks that failed, etc.

In some examples, the processing device can provide an indication to acknowledge whether the refresh operation has started or not. One or more indications can be provided that the refresh operation has started, the refresh operation is in progress, the time since refresh operation has been in progress, the time remaining for the refresh operation to complete, percent completed, the refresh is successfully completed, the refresh operation has aborted, the refresh operation was unsuccessful, the refresh operation is not allowed at this time, etc. In case of a failure, a description of why the failure has occurred can be provided. The description can include information such as device is busy, command for refresh operation is not supported, command for refresh operation is not supported at this time, too soon since the refresh operation was previously performed, etc.

In some examples, performance of the memory sub-system can be temporarily degraded when the refresh operation is being performed. The temporary degradation in performance can allow for a longer term improvement in performance, such as flexibility in re-arranging data, optimizing the refresh using preferred type of optimization settings, more flexibility in terms of algorithms to use during the refresh operation, etc. As a result, the temporary performance degradation can be acceptable as the user intentionally initiates the refresh operation at a convenient time while expecting the temporary degradation to take place. The user can avoid initiating other tasks using the memory sub-system when the user can expect the refresh operation causing temporary performance degradation. Therefore, one advantage of the refresh operation is that the user can control the timing of the refresh operation and plan accordingly.

Figure 3:
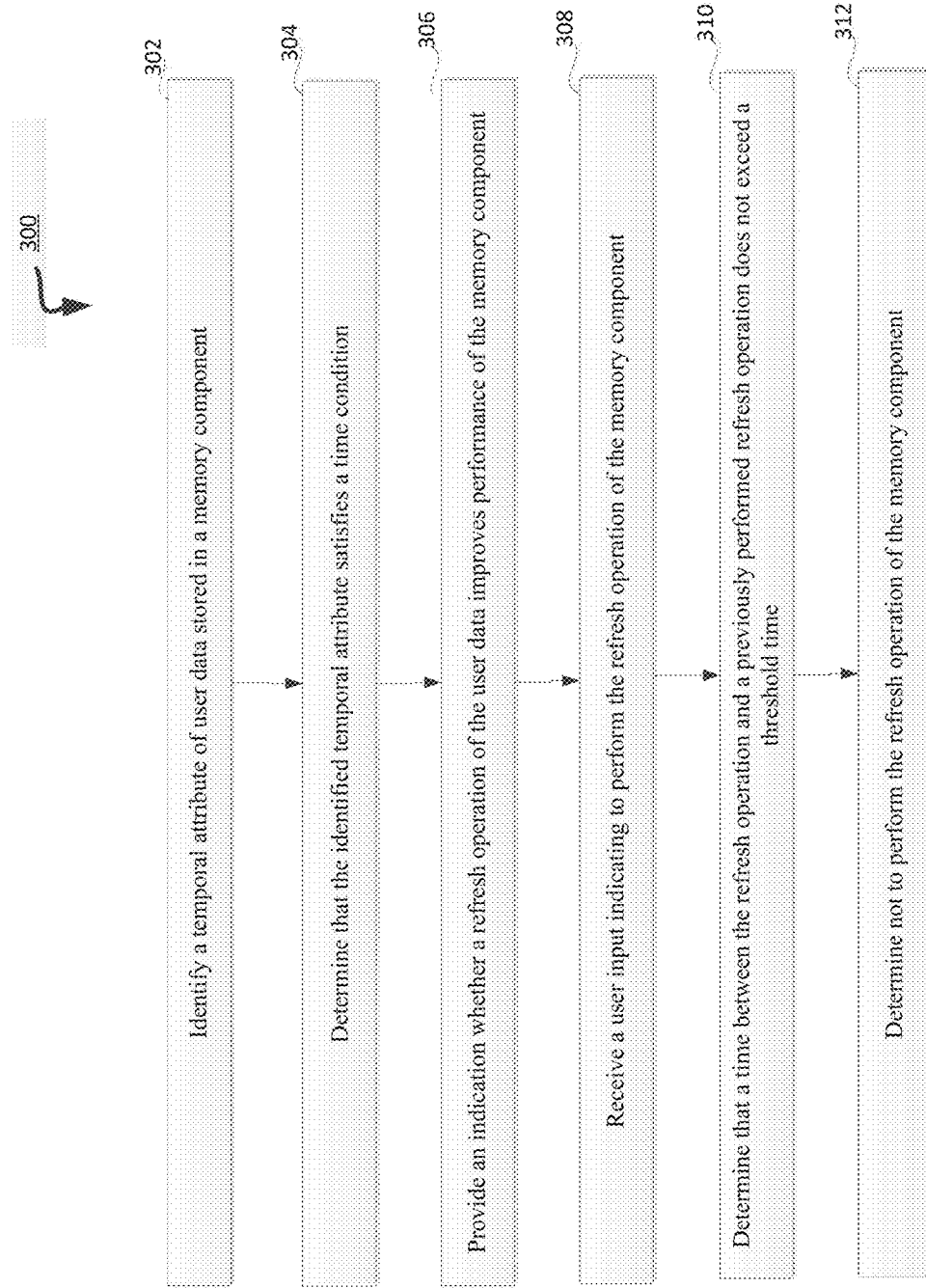
FIG. 3 is a flow diagram of an example method to perform a refresh operation of a memory sub-system based on a time difference between the refresh operation and a previously performed refresh operation, in accordance with some embodiments of the present disclosure.

FIG. 3 is a flow diagram of an example method 300 to perform a refresh operation of a memory sub-system based on a time difference between the refresh operation and a previously performed refresh operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 302, the processing device identifies a temporal attribute of user data stored in a memory component. In an example, the temporal attribute can be an age of the user data, power on hours, or an endurance characteristic. The temporal attribute can be stored as a metadata with the user data and obtained by the processing device. Operation 302 is comparable to operation 202. At operation 304, the processing device determines that the identified temporal attribute satisfies a time condition. Operation 304 is comparable to operation 204. At operation 306, the processing device provides an indication whether a refresh operation of the user data improves performance of the memory component. Operation 306 is comparable to operation 206. At operation 308, the processing device receives a user input indicating to perform the refresh operation of the memory component. Operation 308 is comparable to operation 208.

At operation 310, the processing device determines that a time between the refresh operation and a previously performed refresh operation does not exceed a threshold time. The determination of time between the current refresh and the previous refresh can be used to prevent performing the on demand refresh operation too frequently and degrading the memory sub-system prematurely. As such, a threshold time can be set such that exceeding the threshold time can indicate the refresh operation is not performed too frequently. If it is determined that the time does not exceed the threshold time, the processing device determines that the refresh operation is being performed too frequently. The processing device can provide an indication that it is too soon to perform another refresh operation since the previous refresh operation. The processing device can provide the wait time before another refresh operation can be performed. In some examples, the processing device can provide an indication including the length of time since the previous refresh operation was performed or was attempted. In some examples, the user can initiate a command to receive the indication including the length of time since the previous refresh operation was performed or was attempted.

At operation 312, the processing device determines not to perform the refresh operation of the memory component. The determination not to perform the refresh operation can be based on the time between the refresh operation and the previously performed refresh operation not exceeding the threshold time. In such a scenario, even though the user input indicates to perform the refresh operation, the processing device does not perform the refresh operation.

Figure 4:
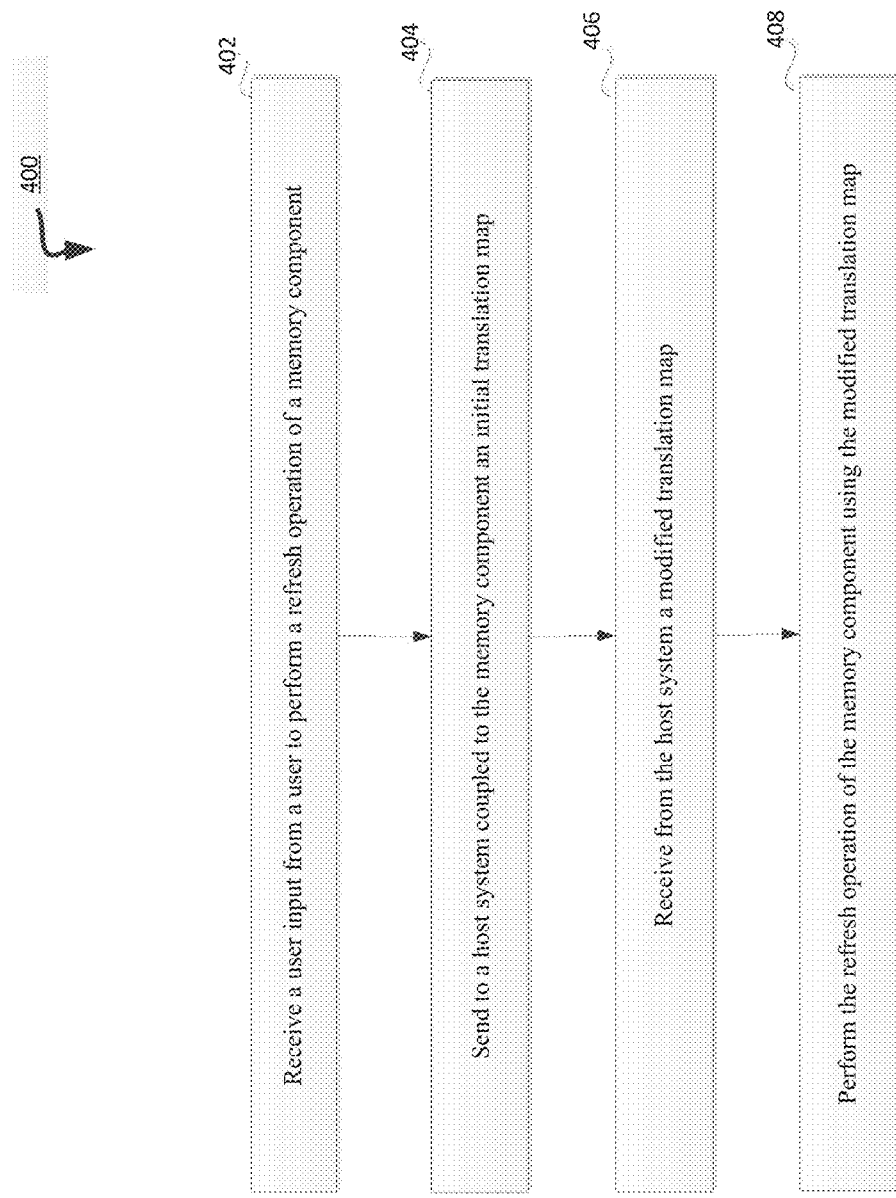
FIG. 4 is a flow diagram of an example method to perform a refresh operation using a modified translation map, in accordance with some embodiments of the present disclosure.

FIG. 4 is a flow diagram of an example method 400 to perform a refresh operation using a modified translation map, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the memory refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing device receives a user input from a user to perform a refresh operation of a memory component. In some example, the user input can be received from a human user, such as a system administrator or a user of the host system. In some example, the user input can be received from a system user. In some example, a user input can be a command that a user can execute. In some example, the user input can include parameters and values of the parameters specified by the user. For example, the user input can indicate to reorganize the user data to optimize the user data for sequential access to the user data.

At operation 404, the processing device sends to a host system coupled to the memory component an initial translation map. In some examples, the initial translation map is configured to map a number of logical block addresses (LBAs) to a number of physical block addresses using a first order. In some example, the first order mapping the LBAs to the physical block addresses in the initial translation map can be in a non-sequential order. For example, the LBAs can be mapped to non-sequential physical block addresses. The initial translation map is sent to the host system because the host system potentially has more memory capacity to process the reorganization of the translation map. In a background refresh operation, for example, the reorganization cannot be performed for a large portion of the translation map due to memory capacity constraint of the memory sub-system. The memory sub-system can typically reorganize a small portion of data during the background refresh operation, which does not significantly improve performance of the user data that is read when using the translation map. The host system, having access to a larger amount of cache memory, can receive a large portion of the initial translation map, or even the entire initial translation map. The host system can reorganize the entire initial translation map according to a sequential logical block order. In cases where sequential access to the user data is faster than random access, reorganizing the translation map so that data can be written back to the memory component in a sequential logical block order can improve performance significantly. After the host system reorganizes the initial translation map, the host system can send the reorganized translation map back to the memory sub-system.

At operation 406, the processing device receives from the host system a modified translation map. In some examples, the modified translation map is configured to map the number of LBAs to the number of physical block addresses using a second order that is different from the first order. In some examples, the modified translation map is the reorganized initial translation map which was reorganized by the host system. In some examples, the host system can suggest a new, more optimal pattern of blocks to be used based on a global or super-block optimization. For example, the optimal pattern of blocks can be based on word line groups, plane selection, the availability of different types of memory cells (e.g., single-level cells (SLCs), multi-level cells (MLCs), triple-level cells (TLCs), and quad-level cells (QLCs)). The modified translation map can be in a sequential logical block order.

At operation 408, the processing device performs the refresh operation of the memory component using the modified translation map. In some examples, the processing device performs the refresh operation of the memory component using the physical block addresses in the second order. In some examples, to perform the refresh operation, the processing device erases user data from a first location of the memory component and performs a write operation on a second location of the memory component using the user data. In some examples, the first and second locations are the same locations, while in other examples the first and second locations are different locations. The write operation can be performed using the second order indicated by the modified translation map.

In some examples, to perform the write operation on the second location, the processing device provides the user data to the host system for storing the user data. For example, the memory sub-system can have limited capacity of cache memory preventing the receiving of an entire superblock of user data to be written in the second order. The host system can be used to temporarily store the contents of the superblock. During the process of temporary storage, the contents of the superblock are not valid until the refresh operation on the entire superblock is completed. The processing device performs the write operation on the second location of the memory component incrementally in a number of stages. A portion of the user data is written to the second location in each stage of the number of stages. Upon completion of performing the write operation using the number of stages, the processing device indicates to the host system to erase the user data from the host system.

Figure 5:
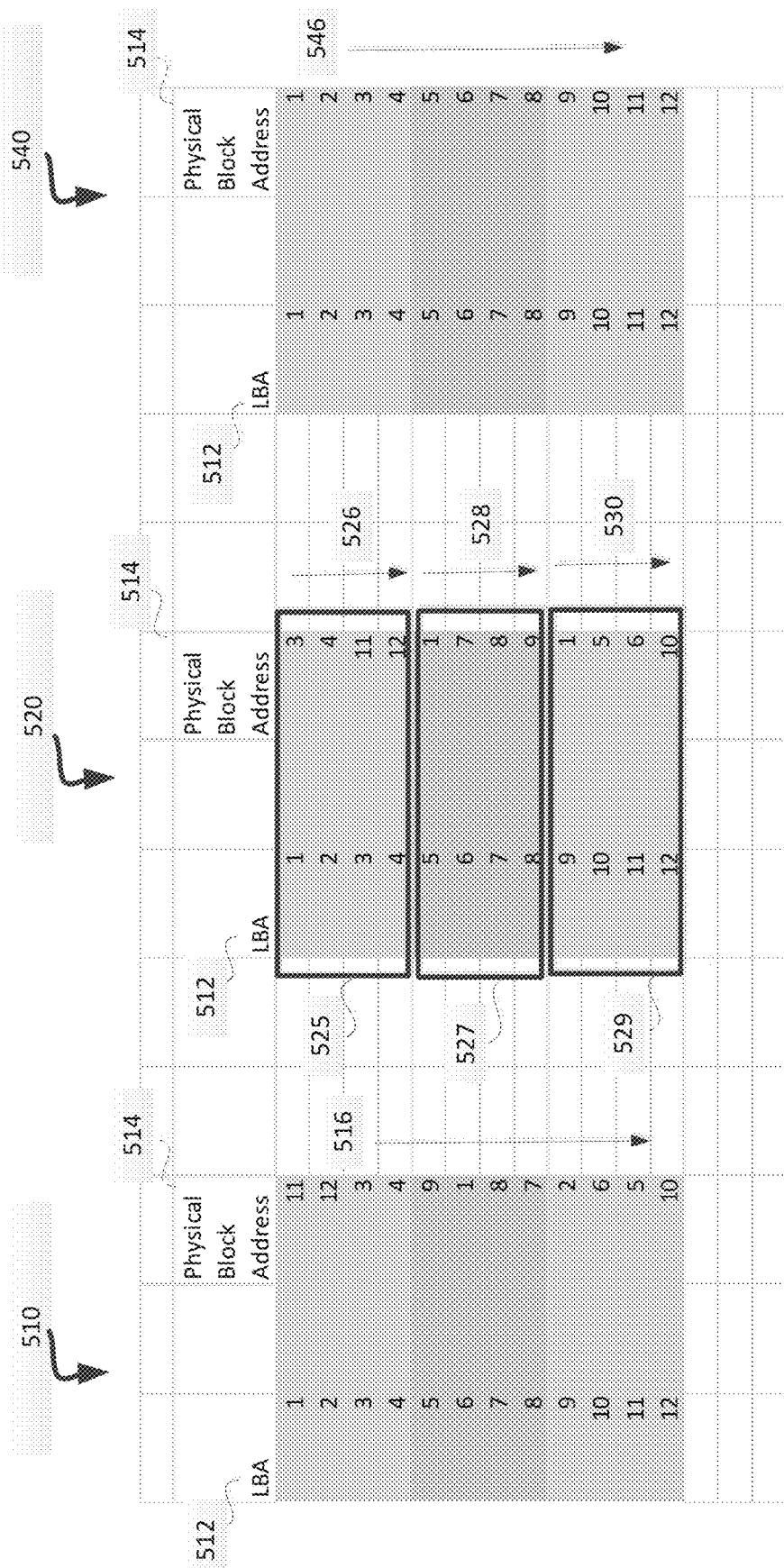
FIG. 5 illustrates an example of modifying a translation map in accordance with some embodiments of the present disclosure.

FIG. 5 illustrates an example of modifying a translation map in accordance with some embodiments of the present disclosure. An initial translation map 510 is shown in FIG. 5 mapping a number of LBA 512 to a number of physical block addresses 514. The initial translation map uses a first order 516 for the physical block addresses. The LBAs 512 include logical block addresses that appear in a sequential order. The corresponding physical block addresses 514 in the first order 516 are depicted to be in a non-sequential order.

FIG. 5 also depicts a modified translation map 520 for an optimization effort used in a background refresh operation. The modified translation map 520 maps the number of LBA 512 to the number of physical block addresses 514 using a different order than first order 516 used in the initial translation map 510. Small subsets of the translation map 520 are individually reorganized during the background refresh operation. As shown, within a subset 525 of the translation map, the physical block addresses 514 are depicted to be reorganized in a sequential order 526. That is, for the subset 525, the LBAs with values 1, 2, 3, and 4 had corresponding physical block address values of 11, 12, 3, and 4, respectively, in the initial translation map 510. Since the background refresh operation can use small subsets for reorganizing the data, for the subset 525, the LBAs with values 1, 2, 3, and 4 are mapped to corresponding physical block address values of 3, 4, 11, and 12, respectively, in the modified translation map 520 in a sequential order 526 within the subset 525. The subset 527 has a sequential order of 528 and subset 529 has a sequential order of 530 for the physical block addresses. However, the entire modified translation map does not have a sequential order for the physical block addresses 514. Thus, the user data is not entirely optimized for sequential read, and performance improvement is not significant.

FIG. 5 depicts a modified translation map 540 using the on demand refresh operation. The entire initial translation map 510 is sent to the host system for reorganization. The physical block addresses 514 of the entire modified translation map have been re-mapped to the LBAs 512 using a second order 546 covering all of the physical block addresses. The second order 546 is different from the first order 516. The entire second order 546 is in a sequential order of the physical block addresses. The modified translation map 540 can be sent to the memory sub-system for use in the rewriting of the data using for the refresh operation using the sequential order of the modified translation map 540. Since the entire translation map is sequentially ordered, the data is entirely optimized for sequential read, and performance improvement is maximized.

Figure 6:
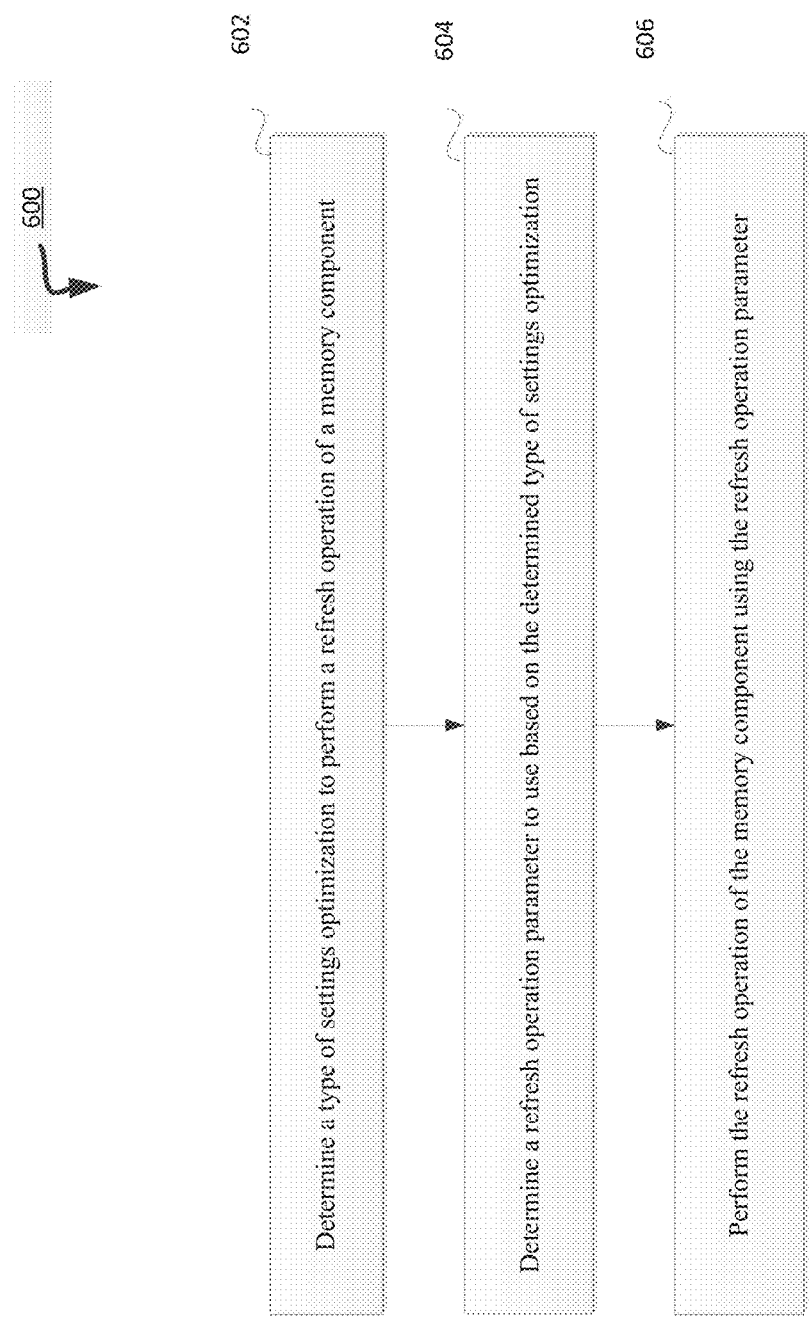
FIG. 6 is a flow diagram of an example method to perform a refresh operation of a memory sub-system based on a type of settings optimization, in accordance with some embodiments of the present disclosure.

FIG. 6 is a flow diagram of an example method 600 to perform a refresh operation of a memory sub-system based on a type of settings optimization, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the memory refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 602, the processing device determines a type of settings optimization to perform a refresh operation of a memory component. The type of settings optimization can include one or a combination of: performance optimization, data retention optimization, endurance optimization, read intensive optimization, or write intensive optimization.

In some implementations, the processing device identifies a workload performed by the memory component and determines the type of settings optimization based on the identified workload. In some examples, the identified workload indicates a workload pattern. The workload pattern can be identified as a write intensive workload pattern, or a read intensive workload pattern. For example, the processing device can identify that the memory sub-system has been executing a read intensive workload for a period of time elapsed. As a result, the processing device can determine to switch to a write intensive workload for the next refresh operation. In some implementations, the processing device receives a user input indicating the type of settings optimization. The processing device then determines the type of settings optimization based on the user input.

For example, if a user expects to initiate a refresh operation in a frequent interval (e.g., every two weeks), then the user can deprioritize the data retention aspect of an optimization since data does not need to be retained for a long period. As such, the user can prioritize performance of the data and indicate to optimize the writing of the data during the refresh operation for performance of the data read. The user can provide a user input indicating the type of settings optimization to be a performance optimization. In another example, a user of a database system can expect the workload for the database system to be read intensive. The user can provide a user input indicating the type of settings optimization to be a read intensive optimization.

At operation 604, the processing device determines a refresh operation parameter to use based on the determined type of settings optimization. In some examples, the refresh operation parameter can be a particular setting. The particular setting can be a "TRIM" setting of the memory sub-system. TRIM settings are values in registers in the memory sub-system that causes the memory sub-system to behave differently. For example, a TRIM setting can include the default amount of word-line current to use in a standard write operation. In another example, the default threshold voltage for a read operation is specified in the TRIM setting. In some examples, the particular setting can include one or a combination of: a threshold voltage to use for the refresh operation, a specified level of current to use for the refresh operation, a specified level of intensity to use for the refresh operation (e.g., a particular voltage level), a duration of time to use for the refresh operation, or a number of pulses of a write operation used for the refresh operation. The memory sub-system can modify the value of the particular setting that can achieve the determined type of settings optimization. Based on the particular setting used, the memory sub-system behaves differently (e.g., write faster, write slower, etc.).

In other examples, a particular setting can also identify where data is written. Typically, it is faster to write data to a cell with fewer bits. The cell with fewer bits have more margin for reading data back and hence better data retention. If there are more bits per cell, then write performance is generally slower as writing the data can take a longer amount of time and there is a decreased probability of successfully reading the data back as the data ages. As such, for example, in a performance only optimization, frequently accessed data can be written to cells configured for fewer bits per cell, while less frequently accessed data can be written to higher bits per cell locations. In a retention only optimization, some cells can be reconfigured to reduce the number of bits per cell on some blocks and allow for more margins in reading the cell while still maintaining capacity of the device.

As discussed before, with the passage of time, the threshold voltage applied to read the data can shift naturally based on various factors, such as, the particular type of memory component, whether a charge loss condition has occurred, etc. The TRIM values can set the read threshold voltage to use during a read operation. In an example, if the type of settings optimization is determined as a performance optimization, then the read threshold voltage can be set to be within a first specified range, such that successful read operation can be achieved and error handling flow can be avoided. In another example, if the type of settings optimization is determined as an endurance optimization, the read threshold voltage can be set to be within a second specified range to achieve the desired endurance.

For example, if the type of settings optimization is determined to be a write intensive optimization, the specified level of current to use or the threshold voltage to use for the write operation for the refresh operation can be selected to be at a higher level than the threshold voltage would be for a read intensive optimization. The higher level of current or threshold voltage can cause the write operation to be faster.

In another example, if the type of settings optimization is determined to be a read intensive optimization, then the write operation can be performed using a slower write so that the probability of a successful first read of the data is increased and the overall read speed is increased as a result. Typically, when performing a write operation, multiple passes are used for completing the write operation. In doing so, quality of the write operation is balanced against the performance of the write operation. Quality indicates how accurate the data is and performance indicates how fast the operation is performed. There is generally a trade-off between quality and performance, such that if the quality is increased, the performance can decrease. Under normal operating conditions, the operation is desired to be fast while retaining a minimum amount of charge to provide good quality of the data. In an on demand refresh scenario, performance (e.g., speed) can be allowed to be decreased as temporary performance degradation can be acceptable. The write operation can be performed with more accuracy and in a slow manner, so that the necessary amount of charge can enter each memory cell. As a result, the read performance is improved due to accuracy achieved during the write operation. A better write accuracy can also be achieved by allowing more passes to complete the write operation. Additionally, less current can be used which can increase the time to perform the write operation.

At operation 606, the processing device performs the refresh operation of the memory component using the refresh operation parameter (e.g., a particular setting). In some examples, the processing device can erase the user data from a first location of the memory component and perform a write operation on a second location of the memory component using the user data. In some examples, the first location and the second location are different locations from each other. In some examples, the first location is same as the second location.

Figure 7:
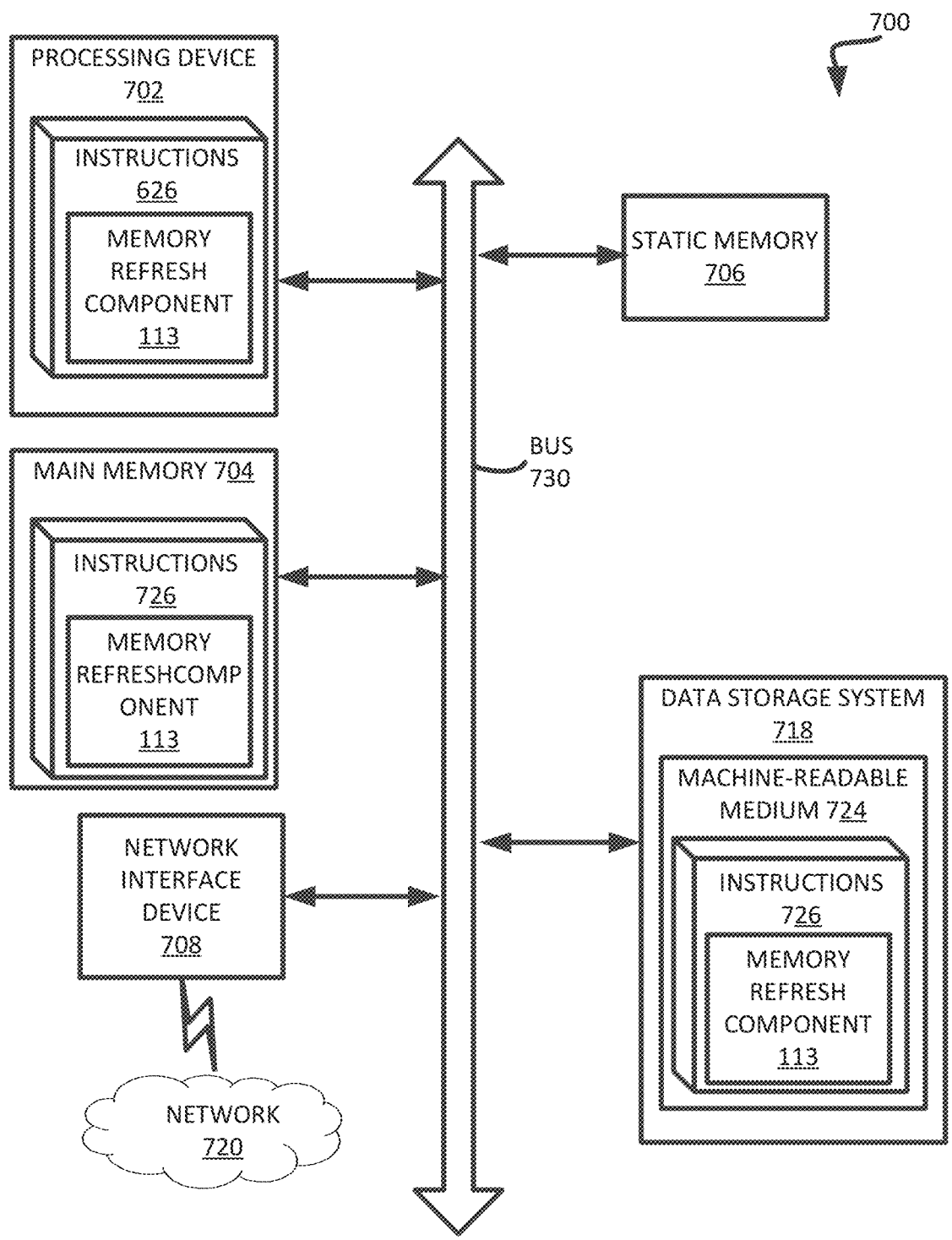
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory refresh component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a memory refresh component (e.g., the memory refresh component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory component; and
    a processing device, operatively coupled with the memory component, to:
        identify a temporal attribute of user data stored in the memory component;
        determine that the identified temporal attribute satisfies a time condition;
        upon determining that the identified temporal attribute satisfies the time condition, provide an indication whether a refresh operation of the user data improves performance of the memory component;
        receive a user input indicating to perform the refresh operation of the memory component; and
        perform the refresh operation of the memory component.

2. The system of claim 1, wherein the temporal attribute represents an amount of time that has elapsed since the user data was stored in the memory component, wherein to determine that the identified temporal attribute satisfies the time condition, the processing device is to:
    determine that the amount of time that has elapsed exceeds a threshold amount of time.

3. The system of claim 1, wherein to provide the indication whether the refresh operation of the user data improves performance of the memory component, the processing device is to provide at least one of:
    the indication identifying that the refresh operation of the user data improves performance of the memory component; or
    the indication identifying that the refresh operation of the user data does not improve performance of the memory component.

4. The system of claim 1, wherein to provide the indication whether the refresh operation of the user data improves performance of the memory component, the processing device is to provide a probability of success of the refresh operation of the user data to improve performance of the memory component.

5. The system of claim 1, wherein to provide the indication whether the refresh operation of the user data improves performance of the memory component, the processing device is to:
    provide the indication to a host system coupled to the memory component to identify whether the refresh operation of the user data improves performance of the memory component.

6. The system of claim 1, wherein to perform the refresh operation of the memory component, the processing device is to:
    erase the user data from a first location of the memory component; and
    perform a write operation on a second location of the memory component using the user data.

7. The system of claim 6, wherein the first location is the same as the second location.

8. The system of claim 1, wherein the processing device is further to:

provide one or more information associated with the refresh operation, the one or more information comprising one or more of:
- a number of total refresh operations attempted in association with memory component;
- a number of successful refresh operations attempted in association with the memory component;
- a number of unsuccessful refresh operations attempted in association with the memory component;
- an average time to complete refresh operations attempted in association with the memory component;
- a standard deviation of time to complete refresh operations attempted in association with the memory component;
- a first status of the refresh operation; or
- a second status of a previous refresh operation attempted in association with the memory component.

9. The system of claim 1, wherein prior to performing the refresh operation of the memory component, the processing device is to:
determine that a time between the refresh operation and a previously performed refresh operation exceeds a threshold time.

* * * * *